United States Patent [19]

Furusawa et al.

[11] Patent Number: 4,597,092
[45] Date of Patent: Jun. 24, 1986

[54] CONSERVING STORED CHARGE IN APPARATUS HAVING A CHARGE COUPLED DEVICE

[75] Inventors: Toshihiro Furusawa, Gifu; Nobuhiro Mitani, Ohgaki, both of Japan

[73] Assignee: Sanyo Electric Co., Ltd., Osaka, Japan

[21] Appl. No.: 598,789

[22] Filed: Apr. 10, 1984

[30] Foreign Application Priority Data

Apr. 19, 1983 [JP] Japan .................. 58-69492

[51] Int. Cl.[4] .............................................. G11C 19/28
[52] U.S. Cl. ........................................ 377/63; 377/58; 377/61
[58] Field of Search .................. 377/63, 62, 58, 61; 365/183; 357/24

[56] References Cited

U.S. PATENT DOCUMENTS 3,838,293 9/1974 Shah ........................ 307/246
3,986,176 10/1976 Weimer ..................... 377/62

FOREIGN PATENT DOCUMENTS 57-53012 11/1982 Japan .
17599 2/1983 Japan ..................... 365/183
1573771 8/1980 United Kingdom .

Primary Examiner—John S. Heyman
Assistant Examiner—K. Ohralik
Attorney, Agent, or Firm—Wenderoth, Lind & Ponack

[57] ABSTRACT

An apparatus having a charge coupled device which is used as a solid state type image pickup apparatus and prior to inversion of the level of drive pulses supplied to two electrode groups from among a plurality of electrode groups of a CCD, each electrode group is disconnected once electrically from each drive pulse generating circuit, in which period two electrode groups whose level of drive pulse are inverted are electrically short-circuited, whereby all the charges in capacitors formed between the electrodes and a substrate are not discharged but about half of the charges can be reused for charging another capacitor which is formed between the electrodes and the substrate and is to be charged next, thus enabling a saving of power consumption, a reduction of heat dissipation losses, and enabling the miniaturization of the image pickup apparatus using a charge coupled device.

3 Claims, 8 Drawing Figures

CONSERVING STORED CHARGE IN APPARATUS HAVING A CHARGE COUPLED DEVICE

BACKGROUND OF THE INVENTION

(1) Field of the Invention

This invention relates to an apparatus having a charge coupled device, and more particularly to an apparatus having a charge coupled device which is so constructed that a part of charge which is discharged from electrodes of the charge coupled device is reused to charge other electrodes, thereby reducing power consumption, and heat dissipation losses and enabling the miniaturization of the apparatus.

(2) Description of the Prior Art

The charge coupled device (CCD) has originally been developed as a shift register or a delay line, which at present is developed to be applied widely to an image pickup apparatus by the use of its photoelectric conversion function.

FIG. 1 is a sectional view exemplary of the conventional CCD of the two-phase type, in which reference numeral 1 designates a semiconductor substrate of silicon, and numeral 2 designates an insulating layer of silicon dioxide over the substrate 1, and numerals 31, 31', 32 and 32' designate electrode groups disposed on the insulating layer 2, which comprise a large number of first electrode pairs 310 of upper and lower electrodes 31 and 31' connected to each other and of second electrode pairs 320 of adjacent upper and lower electrodes 32 and 32' connected to each other, the electrode pairs 310 and 320 being disposed alternately.

The conventional apparatus using the CCD constructed as the above, as shown in FIG. 2, applies a drive pulse $\phi$ from a first drive circuit 51 to a capacitor $C_1$ representing the gross capacity of a large number of first electrode pairs 310 of CCD 4, and simultaneously drive pulse $\bar{\phi}$ from a second drive circuit 52 to a capacitor $C_2$ representing the gross capacity of a large number of second electrode pairs 320 of CCD4, so that a potential well V formed at the semiconductor substrate 1 moves as shown by the broken line in FIG. 1 whereby the charges, for example, electrons, which are trapped by the potential well V, are transferred.

The first and second drive circuits 51 and 52 amplify clock pulses CLK and $\overline{CLK}$ from clock oscillators to the predetermined voltage values respectively. Concretely, a drive circuit 5, as shown in FIG. 3, is used, in which between the constant voltage source E and ground, a series circuit is connected which consists of a resistance $R_1$, a transistor $T_1$ whose base is supplied with clock pulse CLK, and a resistance $R_2$; a series circuit consists of a resistance $R_3$, a transistor $T_2$ whose base is connected to the collector of transistor $T_1$, a diode D and a transistor $T_3$ whose base is connected to the emitter of transistor $T_1$, are connected in parallel to the first series circuit, and the transistor $T_3$ collector is connected to a capacitor C formed between the electrodes 31, 31 ..., 31', 31' ... and 32, 32 ..., 32', 32' ... and the substrate 1. In other words, when the clock pulse CLK changes from a "H" (high) level to a "L" (low) level, the transistor $T_1$ is off, $T_2$ is on, and $T_3$ is off, so that a charging current from the constant voltage source E flows into the capacitor C of the CCD 4 through the resistance $R_3$, transistor $T_2$ and diode D. Conversely, when the clock pulse CLK changes from "L" level to "H" level, the transistor $T_1$ is on, $T_2$ is off, and $T_3$ is on, so that a discharge current ib flows to ground through the transistor $T_3$.

FIG. 4 is a structural view exemplary of the conventional solid image pickup apparatus applying the aforesaid apparatus having a charge coupled device.

In the same figure, reference numeral 40 designates an image pickup device comprising the CCD shown in FIG. 1. The image pickup device 40 comprises an image pickup unit 4P receiving optical images and photoelectrically converting them to obtain charge images, a storage unit 4A into which the charge images from the image pickup unit 4P are transferred and received therein and then temporarily stored, and a horizontal transfer unit 4H which transfers and outputs the charge images of storage unit 4A each scanning line. Reference numerals 51P, 52P, 51A, 52A, 51H and 52H designate drive circuits as shown in FIG. 3 respectively, which supply drive pulses $\phi P$, $\bar{\phi}P$, $\phi A$, $\bar{\phi}A$, $\phi H$ and $\bar{\phi}H$ to the image pickup unit 4P, storage unit 4A and horizontal transfer unit 4H at the image pickup element 40 on the basis of clock pulses CLK-P, $\overline{CLK}$-P, CLK-A, $\overline{CLK}$-A, CLK-H and $\overline{CLK}$-H.

In such conventional image pickup apparatus, the first and second electrode pairs 310 and 320 which are supplied with drive pulses $\phi$ and $\bar{\phi}$ are provided as shown in FIG. 1 throughout the overall surfaces of image pickup unit 4P, storage unit 4A and horizontal transfer unit 4H at the image pickup element 40, resulting in a capacitor of large capacity being formed between the electrode pairs 310 and 320 and the grounded semiconductor substrate 1, the capacity being in the range of between several hundreds of PF through several thousands of PF.

Hence, the charging and discharge currents from the drive circuits 51P, 52P, 51A, 52A ... to the image pickup element 40 become larger, whereby the consumption current becomes larger and the heat dissipation losses increase, thus requiring a fairly large radiator for heat radiation. Hence, in a case where such a charge coupling apparatus is used in, for example, an image pickup apparatus, a problem occurs in that the image pickup apparatus is difficult to miniaturize.

OBJECT OF THE INVENTION

An object of the invention is to provide an apparatus having a charge coupled device which reuses a part of discharge current from the electrode at the CCD so as to charge other electrodes, thereby saving power consumption and reducing heat dissipation losses.

Another object of the invention is to provide an apparatus having a charge coupled device which needs no heat radiator of large capacity and is small-sized in comparison with conventional devices.

The above and further objects and features of the invention will more fully be apparent from the following detailed description with accompanying drawings.

DETAILED DESCRIPTION OF THE INVENTION

Figure 1:
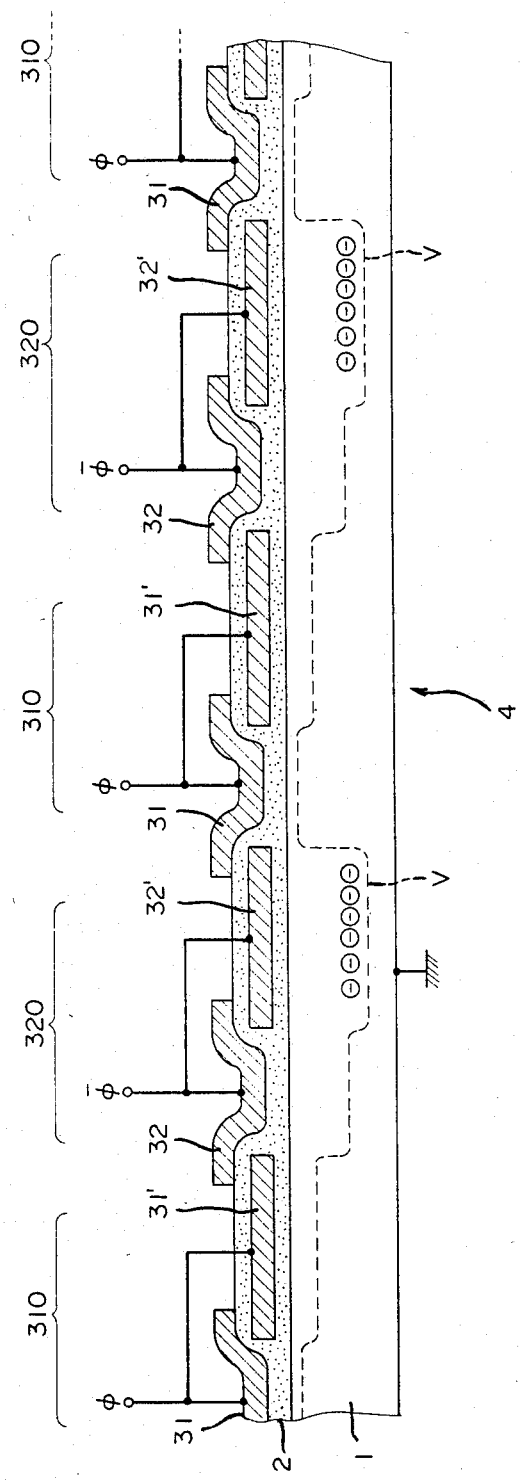
FIG. 1 is a structural view in section exemplary of a conventional CCD.
Figure 3:
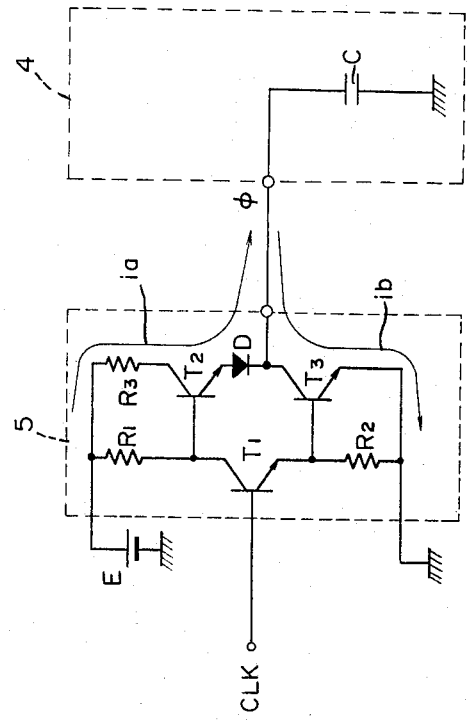
FIG. 3 is a circuit diagram of a drive circuit for a conventional CCD.
Figure 2:
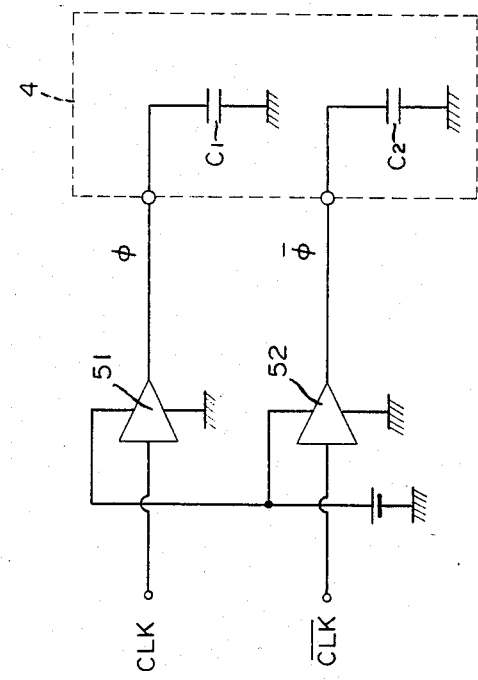
FIG. 2 is an equivalent circuit diagram of a conventional apparatus having a charge coupled device.
Figures 4, 5:
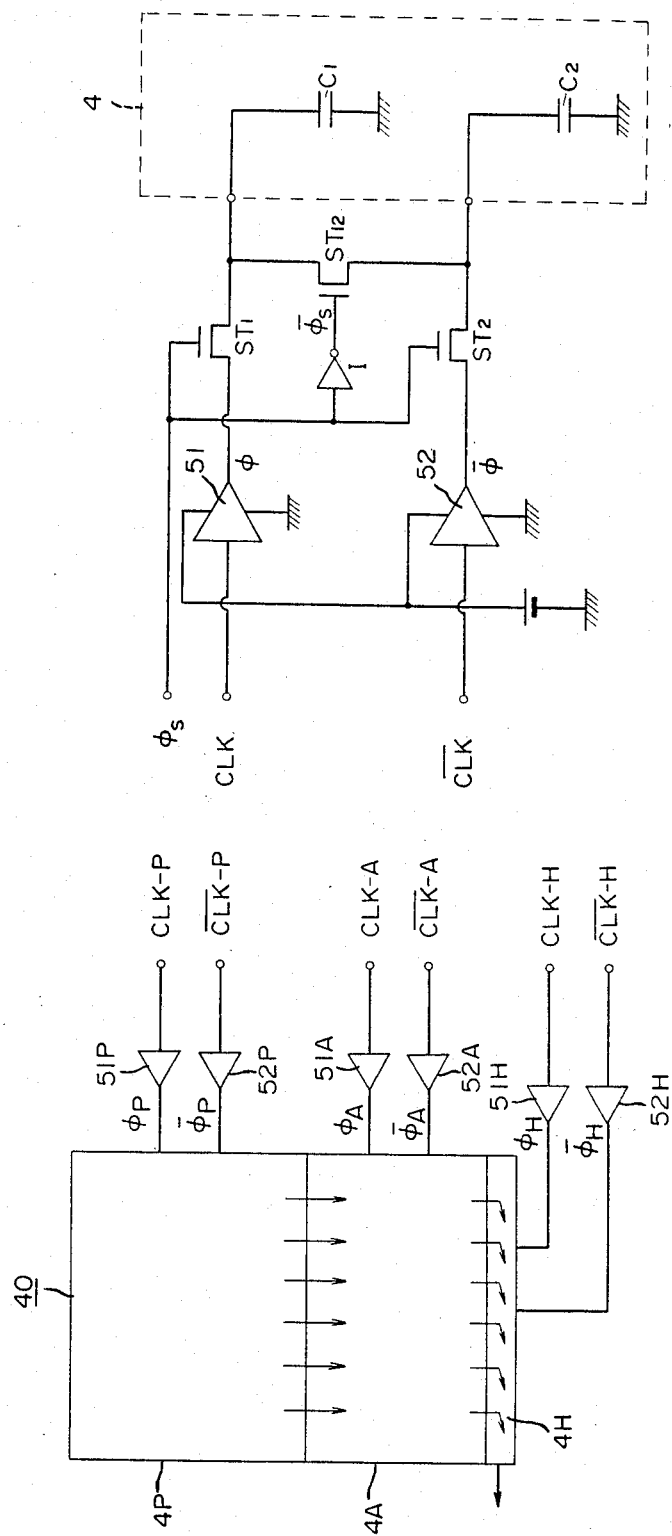
FIG. 4 is a view exemplary of a conventional solid image pickup apparatus.
FIG. 5 is an equivalent circuit diagram of drive circuits for an apparatus in accordance with the invention.

An equivalent circuit at the apparatus with charge coupled device of two-phase type of the invention is shown in FIG. 5, in which reference numerals 4, 51 and 52 designate the CCD, and first and second drive circuits which are the same as those used in the conventional apparatus of FIG. 2. An apparatus in accordance with the invention is different from a conventional one in having; a first switching transistor $ST_1$ for switching the pulse feed line for feeding first drive pulses from a first drive circuit 51 to a first capacitor $C_1$ (in other words, a large number of first electrode pairs 310 as shown in FIG. 1) of a CCD 4; a second switching transistor $ST_2$ for switching the pulse feed line for feeding second drive pulses from a second drive circuit 52 to a second capacitor $C_2$ (in other words, to a large number of second electrode pairs 320 as shown in FIG. 1) of the CCD4; and a third switching transistor $ST_{12}$ for switching a short-circuiting line provided between a first and second capacitors $C_1$ and $C_2$, i.e., between both electrode pairs 310 and 320. Concretely, the transistors $ST_1$, $ST_2$ and $ST_{12}$ each comprise a MOS FET (Metal-Oxide-Semiconductor Field Effect Transistor), the first and second transistors $ST_1$ and $ST_2$ having their gates supplied thereof with control pulse $\phi_s$, the third transistor $ST_{12}$ having its gate supplied with control pulse $\bar{\phi}_s$ which is an inverted version of the control pulse $\phi_s$ and is generated by an inverter I.

Figure 6:
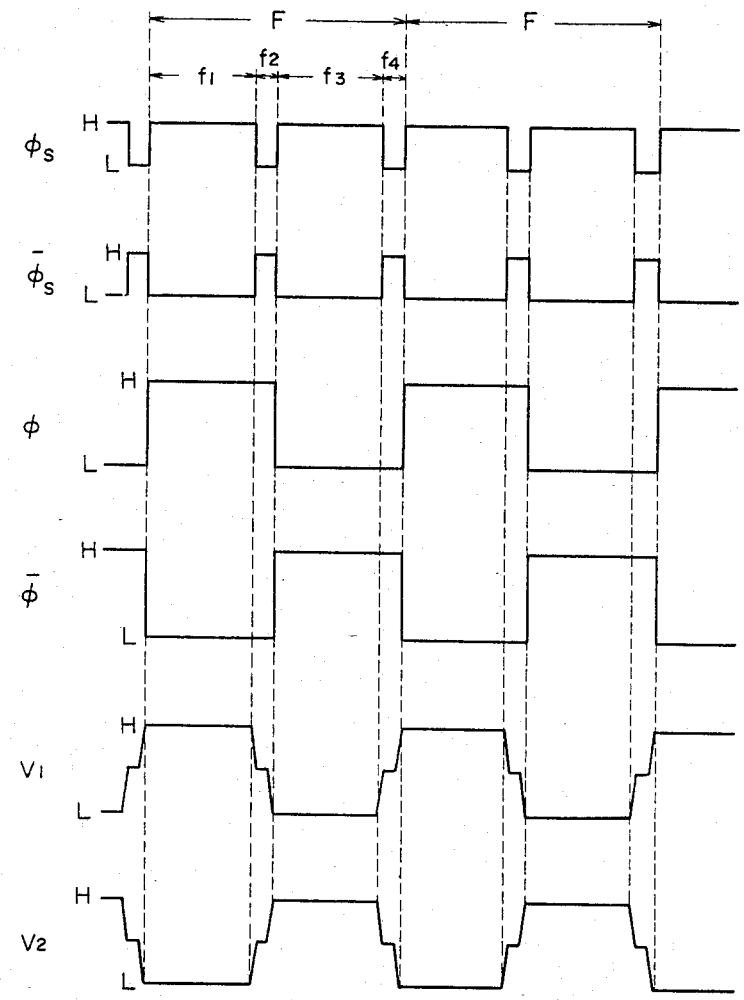
FIG. 6 is a timing chart of an apparatus in accordance with the present invention.

Next, an explanation will be given on operation of the apparatus of the invention by reference to the timing chart in FIG. 6, in which a cycle period F represents two cycle periods of each control pulse $\phi_s$ or $\bar{\phi}_s$, one cycle period of each drive pulse $\phi$ or $\bar{\phi}$, and one cycle period of each electrode potential $V_1$ or $V_2$ of the CCD4, and is divided into small serial sections $f_1$, $f_2$, $f_3$ and $f_4$.

Firstly, since, in the cycle period $f_1$, the control pulse $\phi_s$ is at an "H" level and $\bar{\phi}_s$ at an "L" level, the first and second switching transistors $ST_1$ and $ST_2$ are on, the third switching transistor $ST_{12}$ is off, and the drive pulse $\phi$ at the "H" level is supplied from the first drive circuit 51 to the first capacitor $C_1$ (in other words, a large number of first electrode pairs 310, 310 . . . in FIG. 1) of the CCD4 through the first switching transistor $ST_1$, whereby the electrode potential $V_1$ changes to an "H" level from the "L" level. On the other hand, the drive pulse $\bar{\phi}$ at the "L" level is supplied from the second drive circuit 52 to the second capacitor $C_2$ (in other words, a large number of second electrode pairs 320, 320 . . . in FIG. 1) of the CCD4 through the second switching transistor $ST_2$, whereby the electrode potential $V_2$ changes to the "L" level (ground potential).

Next, in the relatively short cycle period $f_2$ in continuation of cycle period $f_1$, since the control pulse $\phi_s$ changes to "L" level and that $\bar{\phi}_s$ changes to an "H" level, the first and second switching transistors $ST_1$ and $ST_2$ are off, the third switching transistor $ST_{12}$ is on, and the first and second drive circuits 51 and 52 are disconnected electrically from the first and second capacitors $C_1$ and $C_2$, so that the capacitors $C_1$ and $C_2$ are short-circuited by the third switching transistor $ST_{12}$. Accordingly, a discharge current by charge in the first capacitor $C_1$, i.e., the first electrode pairs 310, 310 . . . , of the CCD4 does not flow to ground, but becomes a charging current flowing into the second capacitor $C_2$, i.e., the second electrode pairs 320, 320 . . . , of the CCD4 through the third switching transistor $ST_{12}$, whereby the electrode potentials $V_1$ and $V_2$ each changes to an intermediate level between "H" level and the "L" level.

In the cycle period $f_3$ in continuation of $f_2$, the first and second switching transistors $ST_1$ and $ST_2$ are on, and $ST_{12}$ is off as the same as the period $f_1$, so that the drive pulse $\phi$ at an "L" level is supplied from the first drive circuit 51 to the first capacitor $C_1$ of the CCD4, i.e., the first electrode pairs 310, whereby the electrode potential $V_1$ changes an to "L" level, at which time the electrode potential $V_1$ at the first electrode pairs 310 is firstly at an intermediate level between the "H" level and the "L" level, so that the discharge current flowing to ground from the electrode pairs 310 through the first drive circuit 51 becomes about half of that required in the conventional apparatus in FIG. 2. On the other hand, the drive pulse $\bar{\phi}$ at a "H" level is supplied from the second drive circuit 52 to the second capacitor $C_2$ of the CCD4, i.e., the second electrode pairs 320, through the second switching transistor $ST_2$, whereby the electrode potential $V_2$ changes to an "H" level, at which time the electrode potential $V_2$ on the second electrode pairs 320 is firstly at an intermediate level between the "H" level and the "L" level, whereby the charging current to be charged from the constant voltage source E to the electrode pairs 320 through the second drive circuit 52 becomes about half of that required in the conventional apparatus in FIG. 2.

Next, also in the relatively short cycle period $f_4$ in continuation of $f_3$, the first and second switching transistors $ST_1$ and $ST_2$ are off and the third switching transistor $ST_{12}$ is on in the same fashion as in the cycle period $f_2$, so that the first and second drive circuits 51 and 52 are disconnected electrically from the first and second capacitors $C_1$ and $C_2$ of the CCD4, both the capacitors $C_1$ and $C_2$ being short-circuited by the third switching transistor $ST_{12}$. Accordingly, reversely to the cycle period $f_2$, the discharge current by the charge in the second capacitor $C_2$ of the CCD4, i.e., the second electrode pairs 320, 320 . . . , becomes a charging current to flow into the first capacitor $C_1$ of the CCD4, i.e., the electrode pairs 310, 310 . . . , whereby each electrode potential $V_1$ and $V_2$ changes to an intermediate level between the "H" level and the "L" level.

Figure 7:
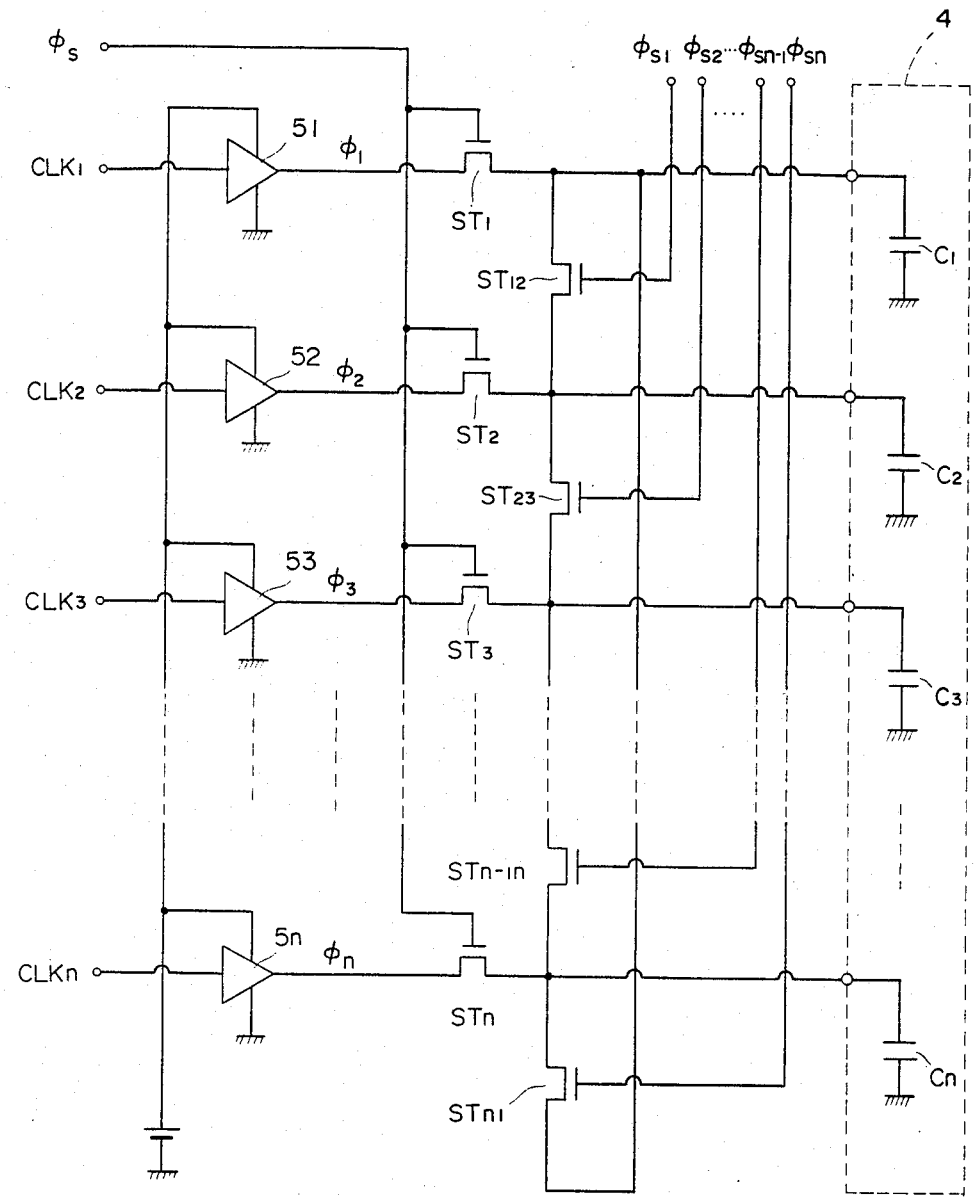
FIG. 7 is an equivalent circuit diagram of a modified embodiment of an apparatus in accordance with the present invention.

FIG. 7 illustrates an equivalent circuit of a modified embodiment of the apparatus of the present invention, as applied to a multi-phase type apparatus.

This embodiment of the apparatus of the invention is provided with; the conventional drive circuits of the two-phase type shown in FIG. 2, in number corresponding to the phase number; switching transistors $ST_1$, $ST_2$, $ST_3$ . . . $ST_n$ for switching the pulse feed lines for feeding the drive pulses $\phi_1$, $\phi_2$ . . . $\phi_n$ to the capacitors $C_1$, $C_2$ . . . $C_n$ (in other words, a large number of electrode pairs 310, 320 . . . shown in FIG. 1) of the CCD4, and switching transistors $ST_{12}$, $ST_{23}$, $ST_{34}$ . . . $ST_{n1}$ for switching the short-circuit lines provided between each pair of adjacent capacitors $C_1$ and $C_2$, $C_2$ and $C_3$ . . . $C_{n-1}$ and $C_n$, and $C_n$ and $C_1$.

The switching transistors $ST_1$, $ST_2$ . . . $ST_n$ and $ST_{12}$, $ST_{23}$ . . . $ST_{n1}$ each comprise a MOS FET, those $ST_1$, $ST_2 \ldots ST_n$ being supplied with the control pulse $\phi_s$ respectively, those $ST_{12}$, $ST_{23} \ldots ST_{n1}$ serving to switch each short-circuit line being supplied with the control pulses $\phi_{s1}$, $\phi_{s2} \ldots \phi_{s3}$ respectively.

Figure 8:
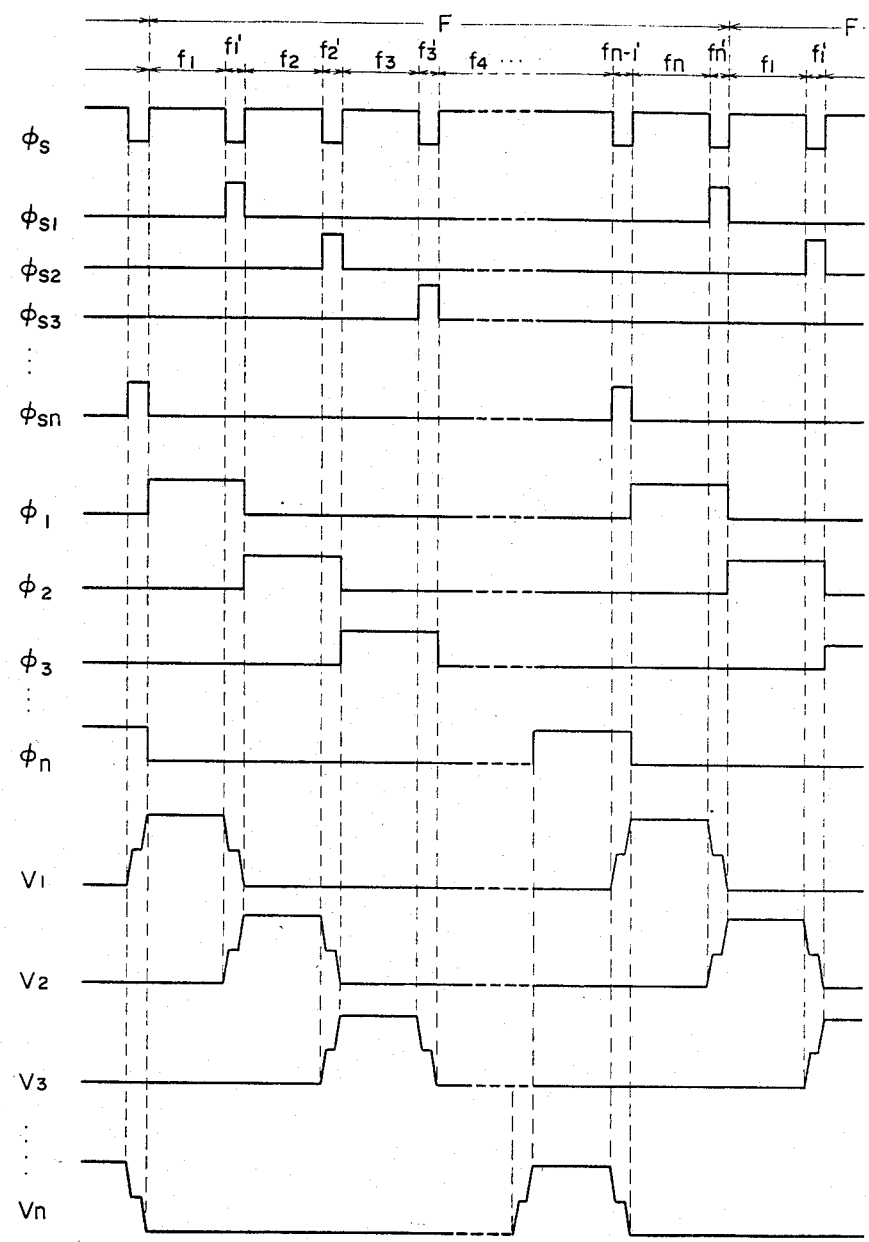
FIG. 8 is a timing chart of the embodiment shown in FIG. 7.

Next, an explanation will be given on operation of the drive circuit at the apparatus of multi-phase type of the above construction by reference to the timing chart of FIG. 8, in which the cycle period F represents n cycle periods of control pulse $\phi_s$ for the switching transistor $ST_1$, $ST_2 \ldots$, or $ST_n$, one cycle period of each control pulse $\phi_{s1}$, $\phi_{s2} \ldots$, or $\phi_{sn}$ for each switching transistor $ST_{12}$, $ST_{23} \ldots$, or $ST_{n1}$, each one cycle period of drive pulses $\phi_1$, $\phi_2 \ldots \phi_n$, and each one cycle period of electrode potentials $V_1$, $V_2 \ldots V_n$ on the electrodes 310, 320, 330 ... of the CCD4, and is divided into small serial cycle periods $f_1$, $f_1'$, $f_2$, $f_2' \ldots f_n$, $f_n'$.

Firstly, in the cycle period $f_1$, the control pulse $\phi_s$ is "H" level, and $\phi_{s1}$, $\phi_{s2} \ldots \phi_{sn}$ each is "L" level, whereby the switching transistors $ST_1$, $ST_2 \ldots ST_n$ are on and those $ST_{12}$, $ST_{23} \ldots ST_{n1}$ are off, but the drive pulse $\phi_1$ from the first drive circuit 51 only is at a "H" level, whereby the first capacitor $C_1$ of the CCD4 only is charged by supplying the drive pulse $\phi_1$.

Next, in the cycle period $f_1$ relatively short and in continuation of cycle period $f_1$, since the control pulse $\phi_s$ changes to the "L" level and the switching transistors $ST_1$, $ST_2 \ldots ST_n$ are off, the drive circuits 51, 52 ... 5n are disconnected electrically from the capacitors $C_1$, $C_2 \ldots C_n$ respectively. In the cycle period $f_1'$, however, the control pulse $\phi_{s1}$ supplied to the switching transistor $ST_{12}$ serving for switching the short-circuit line between the capacitors $C_1$ and $C_2$, only changes to the "H" level, whereby only the switching transistor $ST_{12}$ is on. Hence, the charge in the capacitor $C_1$ flows into the not-charged capacitor $C_2$ through the turned on switching transistor $ST_{12}$, and charges the capacitor $C_2$, whereby potentials $V_1$ and $V_2$ of both capacitors $C_1$ and $C_2$ change to intermediate levels between the "H" level and the "L" level.

In the cycle period $f_2$ in continuation of $f_1'$, the switching transistors $ST_1$, $ST_2 \ldots ST_n$ are on and $ST_{12}$, $ST_{23} \ldots ST_{n1}$ are off as the same as in the cycle period $f_1$, so that the drive pulse $\phi_2$ from the second drive circuit 52 only is at the "H" level, and is supplied to the second capacitor $C_2$ of the CCD4, whereby the second capacitor $C_2$ only is charged and the first capacitor $C_1$ is discharged. At this time, the potential $V_1$ of the first capacitor $C_1$ is at an intermediate level between the "H" level and the "L" level and is discharged to ground through the first drive circuit 51, the discharge current being about half of that the conventional apparatus and the same as that of the first embodiment. On the other hand, at the time of starting of the charging of the second capacitor $C_2$, the potential $V_2$ of capacitor $C_2$ is at an intermediate level between the "H" level and the "L" level, so that a charging current to the capacitor $C_2$ through the drive circuit 52 becomes about half that of the conventional apparatus and the same as that of the first embodiment.

Thereafter, the same operation is repeated sequentially to carry out the charge and discharge of capacitors $C_1$, $C_2 \ldots C_n$ in the order.

As seen from the above, in a case where the apparatus of the invention, constructed as the first and second embodiments, is used for the image pickup device 40 of large capacity, for example, as the capacitors $C_1$ and $C_2$, it is considerably advantageous to reduce power consumption by half, which is largely meaningful for the image pickup apparatus, such as television cameras, using batteries as the power source. Also, this invention of course is not limited to the image pickup apparatus, but applicable to all the apparatus with charge coupled device, such as shift registers or delay lines.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An apparatus having a charge coupled device comprising:
   a charge coupled device comprising a plurality of electrodes sorted into alternate groups and disposed on an insulating layer formed over a semiconductor substrate;
   drive circuits for respectively alternately feeding drive pulses via feed lines to said alternate groups of said charge coupled device in order,
   switching elements for switching said feed lines which respectively feed said drive pulses from said drive circuits to each of said alternate electrode groups of said charge coupled device, and
   short-circuit lines and switching elements connected between electrodes of said alternate groups for switching said short-circuit lines in response to short-circuit drive pulses;
   wherein, prior to a reversal of the level of said drive pulse fed to two electrode groups from among said alternate electrode groups, said switching elements for switching said pulse feed lines are opened so as to respectively disconnect said drive circuits electrically from said electrode groups, at which time said switching elements for switching said short-circuit lines between said alternate electrode groups are closed in response to said short-circuit drive pulses so as to thereby short-circuit said groups.

2. An apparatus having a charge coupled device as set forth in claim 1, wherein said plurality of electrodes are sorted into two groups.

3. An apparatus having a charge coupled device as set forth in claim 1, wherein said plurality of electrodes are sorted into at least three groups.

* * * * *